US006807215B2

(12) United States Patent
Lam et al.

(10) Patent No.: US 6,807,215 B2
(45) Date of Patent: Oct. 19, 2004

(54) TWO-SECTION DISTRIBUTED BRAGG REFLECTOR LASER

(75) Inventors: Yee Loy Lam, Singapore (SG); Yuen Chuen Chan, Singapore (SG); Teik Kooi Ong, Singapore (SG); Hwi Siong Lim, Singapore (SG); Lay Cheng Choo, Singapore (SG); Peh Wei Tan, Singapore (SG)

(73) Assignee: Denselight Semiconductor PTE LTD, Singapore ( * ) Notice: Subject to any disclaimer, the term of this patent is extended or adjusted under 35 U.S.C. 154(b) by 0 days.

(21) Appl. No.: 10/266,893

(22) Filed: Oct. 8, 2002

(65) Prior Publication Data

US 2003/0072344 A1 Apr. 17, 2003

(30) Foreign Application Priority Data

Oct. 9, 2001 (GB) .............................................. 0124217

(51) Int. Cl.[7] .............................. H01S 5/00; H01S 3/08
(52) U.S. Cl. ........................................ 372/50; 372/96
(58) Field of Search ...................................... 372/50, 96

(56) References Cited

U.S. PATENT DOCUMENTS

| 4,631,730 A | | 12/1986 | Miller | |
| 4,755,015 A | | 7/1988 | Uno et al. | |
| 4,873,691 A | * | 10/1989 | Uomi et al. | 372/20 |
| 5,220,578 A | * | 6/1993 | Koch et al. | 372/96 |
| 5,288,659 A | * | 2/1994 | Koch et al. | 438/31 |
| 5,450,428 A | | 9/1995 | Maeda | |
| 6,320,688 B1 | * | 11/2001 | Westbrook et al. | 398/194 |
| 6,349,106 B1 | * | 2/2002 | Coldren | 372/50 |
| 6,608,855 B1 | * | 8/2003 | Hwang et al. | 372/96 |
| 2003/0021314 A1 | * | 1/2003 | Yoshida et al. | 372/45 |
| 2003/0063647 A1 | * | 4/2003 | Yoshida et al. | 372/50 |
| 2003/0067952 A1 | * | 4/2003 | Tsukiji et al. | 372/36 |

FOREIGN PATENT DOCUMENTS

| JP | 200196187 | 7/2000 |
| WO | WO 01/28052 A2 | 4/2001 |

OTHER PUBLICATIONS

Debregeas–Sillard, H. et al. "DBR Module with 20–mW Constant Coupled Output Power, Over 16 nm (40X50–GHz spaced Channels)", IEEE Photonics Technology Letters, vol. 13, No. 1, Jan. 2001, 1041–1135, 3pgs.

(List continued on next page.)

Primary Examiner—Don Wong
Assistant Examiner—Hung T Vy
(74) Attorney, Agent, or Firm—Buckley, Maschoff & Talwalkar LLC

(57) ABSTRACT

There is provided a semiconductor laser comprising a gain section and an adjacent Bragg section, wherein output laser light is emitted via a facet at an interface between air and the gain section, the Bragg section comprising a distributed reflecting structure having a length substantially greater than required to ensure single longitudinal mode operation of the laser in which the side-mode suppression ratio (SMSR) is 35 dB or more, thereby in use substantially suppressing optical feedback from a facet at an interface between the Bragg section and air, and wherein an interface between the Bragg section and the gain section is quantum well intermixed, thereby rendering the interface substantially anti-reflecting at the wavelength of the laser.

19 Claims, 6 Drawing Sheets

OTHER PUBLICATIONS

Choa, F.S. et al. "Very High Sidemode–Suppresion–Ratio Distributed–Bragg–Reflector Lasers Grown by Chemical Beam Epitaxy", Electronics Letters, vol. 28, No. 11, May 21, 1992, ISSN: 0013–519, pp. 1001–1002.

Kjebon, O. et al, "Two–Section InGaAsP DBR–lasers at 1.55 µm wavelength with 31 GHz Direct Modulation Bandwidth", ISBN: 0–7803–3898–7, ©1997 IEEE, pp. 665–668.

Smith, G.M. et al. "Wavelength tunable two–pad ridge waveguide distributed Bragg reflector InGaAs–GaAs quanum well lasers", Electronics Letters, vol. 30, No. 16, Aug. 4, 1994, pp. 1313–1314.

Ke, Maolong et al. "Monolithically integrated distributed Bragg reflector lasers for 1.5 µm operation with band gap shifted grating section", Optical Materials, vol. 14, No. 3, Jul 2000, ©Elsevier Science B. V., ISSN: 0925–3467, pp. 193–196.

Takaski Hirate et al, "Fabrication and Characteristics of GaAs–AlGaAs Tunable Laser Diodes with DBR and Phase–Control Sections Integrated by Compositional Disordering of a Quantum Well", IEEE Journal of Quantum Electronics, vol. 27, No. 6, New York, US, Jun. 1991, XP 000229861, ISSN: 0018–9197, pp. 1609–1615.

"PCT Notification of Transmittal of the International Search Report or the Declaration", European Patent Office Office, 9pgs.

* cited by examiner

TWO-SECTION DISTRIBUTED BRAGG REFLECTOR LASER

This application is a U.S. National filing under 35 U.S.C. §119 hereby claiming priority to GB Application No. 0124217.1 filed Oct. 9, 2001, the contents of which are incorporated herein by reference for all purposes.

FIELD OF THE INVENTION

The present invention relates to tunable semiconductor lasers and particularly to single mode lasers for use in wavelength division multiplexed systems.

BACKGROUND OF THE INVENTION

Single mode wavelength tunable semiconductor lasers are important components in wavelength division multiplexed (WDM) systems. In such applications, the essential parameter that determines the effectiveness of a tunable laser is the inter-channel switching time and the simplicity of the emission-wavelength controlling circuit. Currently, many fixed wavelength laser sources, such as distributed feedback (DFB) lasers, rely on temperature tuning to switch the wavelength between the various channels. In this context, the temperature of the laser is changed to create variations in the bandgap energy and the refractive index, leading to a change in the emission wavelength. The process is relatively simple, but is inherently too slow for fast switching applications.

An alternative approach to wavelength control is through electronic tuning, a technique which can be applied to a two-section distributed Bragg reflector (DBR) laser having a gain section and a Bragg section for tuning. The tuning of the output wavelength can be achieved by varying the wavelength $\lambda_B$ of the Bragg section which satisfies the Bragg condition for constructive interference:

$$\lambda_B = 2n_{eff}\Lambda_g$$

in which $n_{eff}$ and $\Lambda_g$ are the effective refractive index and the grating period of the Bragg section, respectively. In this approach, electrical current is injected into the Bragg section of the laser such that it is perpendicular to the surface of the device. This injection of current causes a change in the carrier density and a corresponding change in the effective refractive index, thereby altering the lasing wavelength that satisfies the Bragg condition. This technique of electronic wavelength tuning allows faster channel switching, such that the switching time is limited only by the speed of the integrated driving and controlling circuitry.

However, two-section DBR lasers suffer from discontinuous wavelength tuning, due to mode jumping from one longitudinal mode of the laser cavity to the next. Typically, a jump occurs every 2–3 nm over a 15 nm tuning range. This so-called mode-hopping occurs primarily because of interference and competition between the optical mode that is determined by the Bragg section and other residual longitudinal Fabry-Perot modes arising within the laser device. For a simple two section device comprising gain and Bragg sections, longitudinal Fabry-Perot modes can arise from cavities formed by Fresnel reflections at the air-gain interface, gain-Bragg region interface and air-Bragg region interface.

In order to reduce optical loss in the Bragg section of the DBR laser, so that higher output power can be achieved, it is desirable that the bandgap energy of the Bragg section be larger than that of the gain section. This is usually accomplished by a growth and regrowth technique resulting in different material composition in the waveguide layers of the gain and Bragg sections. However, this introduces a large mismatch in the transverse refractive index profile of the two sections, leading to the unwanted reflection at the gain-Bragg section interface. For example, a 100 nm detuning in the band edge of the Bragg section relative to the gain section, for a device based on an epitaxial layer of InGaAsP, would result in an abrupt refractive index difference of 0.08 leading to a gain-Bragg interface reflectivity of approximately $2 \times 10^{-4}$, if the waveguides in the two sections are perfectly aligned. However, such perfect alignment is almost impossible to realize given the typical nonuniformity across an epitaxially grown wafer. Thus, if there is also a vertical offset between the waveguides in the two sections, the interface reflectivity increases to $5 \times 10^{-4}$. Variation of the waveguide thickness across the interface will lead to an even higher value.

Even if the exposed facets of the laser device are coated with anti-reflection optical coatings, it is extremely difficult to completely eliminate all the reflections. In fact if, as is usually the case, the laser output is taken from the DBR end of the device, the facet at the opposing end is coated with a high reflectivity (HR) coating at the lasing wavelength, which can further exacerbate the problem of parasitic modes. The situation is even more severe for three, four or five section tunable laser diodes.

However, despite the increased number of Fresnel reflections, the conventional approach to solving this problem is to use a three-section DBR laser, comprising gain, phase and Bragg sections as described by S. Murata, I. Mito and K. Kobayashi in "Tuning ranges for 1.5 μm wavelength tunable DBR lasers", Electron. Lett., vol. 24, pp. 577–579, 1988. In the three section laser, electrical current is also injected into the phase section to adjust the phase of the feedback from the DBR by means of carrier-induced refractive index changes. With the addition of a wavelength reference, this permits stabilization and fine-tuning of the mode frequency, resulting in continuous tuning of the device output wavelength over the entire available range. Other structures derived from the DBR laser are also used, including: sampled grating DBR (SG-DBR) described in C. K. Gardiner, R. G. S. Plumb, P. J. Williams and T. J. Ried, "Wavelength tuning in three section sampled grating DBR lasers", Electron. Lett., vol. 31, pp. 1258–1260, 1995; superstructure grating DBR (SSG-DBR) described in Y. Tohmori, Y. Yoshikuni, T. Tamamura, H. Ishii, Y. Kondo and M. Yamamoto, "Broad-range wavelength tuning in DBR lasers with super structure grating (SSG), IEEE Photon. Technol. Lett., vol. 5, pp. 126–129, 1993; and grating coupled sampled reflectors (GCSR) described in M. Oberg, S. Nilsson, K. Streubel, J. Wallin, L. Backbom and T. Klinga, "74 nm wavelength tuning range of an InGaAsP/InP vertical grating assisted codirectional coupler laser with rear sampled grating reflector", IEEE Photon. Technol. Lett., vol. 5, pp. 735–738, 1993. All these devices are capable of continuous tuning with a larger wavelength tuning range.

However, these types of laser suffer from increased complexity of driving circuitry as compared to the two-section DBR laser. More electrodes (at least three) are required and matching of numerous input currents to the appropriate electrodes is necessary to accurately select a wavelength. In addition, as the device ages under conditions of constant electrical current bias, the carrier density in the semiconducting material will tend to decrease, owing to nucleation of non-radiative defects or increased leakage around the active layer. This leads to a drift of the emission wavelength which, in time, can become significant and may even lead to mode hopping. The use of multiple electrodes in tunable lasers such as the SSG-DBR requires more complex locking algorithms, with associated look-up tables, and the whole issue of wavelength stabilization becomes more complicated. Calibration of the emission wavelength for multiple-electrode tunable laser diodes is also extremely time consuming. Furthermore, the output power that can obtained from SG-DBR, SSG-DBR and GCSR lasers is comparably small, typically limited to a maximum of 10 mW.

Recently, continuous wavelength tuning has been realized by using a two-section DBR laser, disclosed in H. Debrégeas-Sillard, A. Vuong, F. Delorme, J. David, V. Allard, A. Bodéré, O. LeGouezigou, F. Gaborit, J. Rofte, M. Goix, V. Voiriot and J. Jacquet, "DBR module with 20-mW constant coupled output power over 16 nm (40×50GHz spaced channels)", IEEE Photon. Technol. Lett., vol. 13, pp. 4–6, 2001. The operation of the laser in a continuous wavelength tuning mode is achieved through a combination of adjusting the gain current injection, Bragg voltage and temperature of the laser. Although the process is relatively simple, mode hopping occurs when the device is operated at a fixed temperature and control of at least three parameters, including the temperature of the laser, is required to achieve continuous tuning of the wavelength.

Therefore, there is a requirement for a simple technology by means of which hop-free, continuous wavelength tuning of a single-mode laser diode can be achieved, which provides for stable and fast wavelength switching with a minimal number of control parameters, thereby avoiding the high cost, complicated design and other problems associated with the present conventional approaches.

SUMMARY OF THE INVENTION

According to the present invention, a semiconductor laser comprises a gain section and an adjacent Bragg section, wherein output laser light is emitted via a facet at an interface between air and the gain section, the Bragg section comprising a distributed reflecting structure having a length substantially greater than required to ensure single longitudinal mode operation of the laser in which the side-mode suppression ratio (SMSR) is 35 dB or more, thereby in use substantially suppressing optical feedback from a facet at an interface between the Bragg section and air, and wherein an interface between the Bragg section and the gain section is quantum well intermixed, thereby rendering the interface substantially anti-reflecting at the wavelength of the laser.

Preferably, said facet is coated such that its reflectivity is low enough to substantially suppress unwanted Fabry Perot modes, but high enough for efficient laser operation. Typically, the reflectivity of the coated facet will be in the range 1–5%.

To eliminate mode-hopping, it is essential that any unwanted longitudinal Fabry-Perot modes be prevented. This can achieved by substantially eliminating the effective Fresnel reflection at two of the three interfaces associated with the device, namely the air-Bragg section interface and the gain-Bragg section interface.

A reduction in the contribution due to Fresnel reflection at the air-Bragg section interface can be accomplished by antireflection (AR) coating the facet. However, a greater reduction can be achieved by incorporating a Bragg section with a length longer than that typically used or needed to ensure single-frequency lasing operation. Due to the increased reflectivity of the distributed structure, this has the combined effect of reducing the amount of light reaching the air-Bragg section interface from the active gain region and also reducing the amount of reflected light returning to the active gain region.

Therefore, it is preferred that the laser comprises a Bragg section with a length substantially longer than that typically used or required to ensure single-frequency (SLM) lasing operation. Preferably, the facet at the air-Bragg section interface is also AR coated to further reduce the level of unwanted reflected light. However, the use of the longer Bragg section relaxes the requirements on the quality of the AR coating or can indeed negate the requirement for an AR coating.

However, there is still unwanted reflection associated with the gain-Bragg section interface. To eliminate this reflection, there should be no discontinuity in the optical waveguide running through the two sections and the optical mode profile in the two sections should be well matched. This requires a similar transverse refractive index profile for the two sections of the waveguide.

The reduction and smoothing of the refractive index discontinuity typically associated with the gain-Bragg section interface, can be achieved by creating the desired larger bandgap energy in the Bragg region, as compared to the gain region, via a process of quantum well intermixing (QWI), rather than using growth and regrowth techniques. QWI is a post-growth technique that allows tuning of the bandgap in localized sections of the device heterostructure. A good review of QWI has been written by J. H. Marsh in "Quantum well intermixing", Semicond. Sci. Technol., vol. 8, pp. 1136–1155, 1993. By application of a QWI process to the Bragg section, the increase in bandgap energy can be achieved with minimal change to the refractive index profile. In addition, the waveguides in the Bragg and gain sections are inherently in close alignment as no regrowth phase is required.

It is therefore preferred that the band gap of the Bragg section is increased by a QWI process, such that said section is substantially transparent at the lasing wavelength and that the transverse refractive index profile of the waveguide in said section is well matched to that in the gain section. Preferably, the QWI extends a short distance, a few wavelengths, into the gain region so as to smooth any residual refractive index discontinuities.

The frequency tuning and stabilization of the aforementioned two-section DBR laser can be achieved by control of the electrical currents to the gain and Bragg sections of the device. By using appropriate control and feedback circuitry, the emission wavelength can be tuned continuously over a substantial portion of the available range, without mode hopping, while maintaining constant output power and large side-mode suppression ratio (SMSR). Compensation for wavelength drift due to device ageing is also simplified considerably.

BRIEF DESCRIPTION OF THE DRAWINGS

Examples of the present invention will now be described in detail with reference to the accompanying drawings, in which.

DETAILED DESCRIPTION

For a two section DBR laser, there are three interfaces, namely an air-gain section interface, a gain-Bragg section interface and an air-Bragg section interface. Besides the modes introduced by the Bragg grating section, Fabry Perot (FP) modes can also arise from the cavity formed between two of the above three interfaces. Mode hopping occurs essentially from competition between the grating and FP modes as the grating modes are shifted as the current injection to the Bragg section increases.

Figure 1:
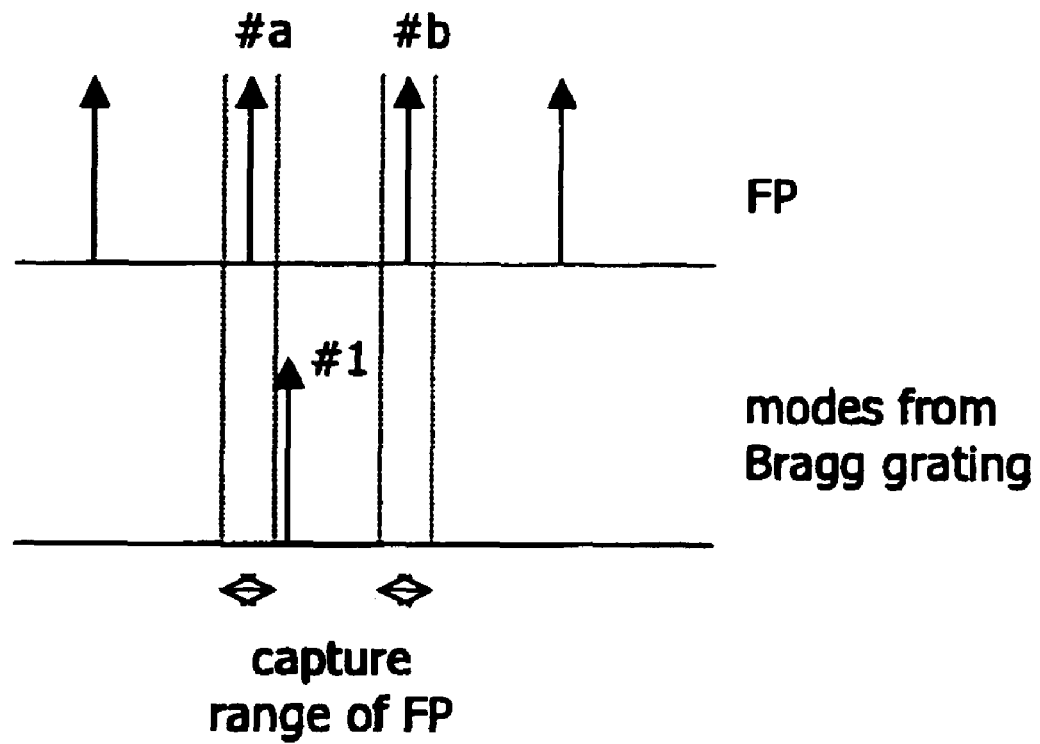
FIGS. 1 and 2 illustrate mode hopping in a conventional two-section DBR laser.
Figure 2:
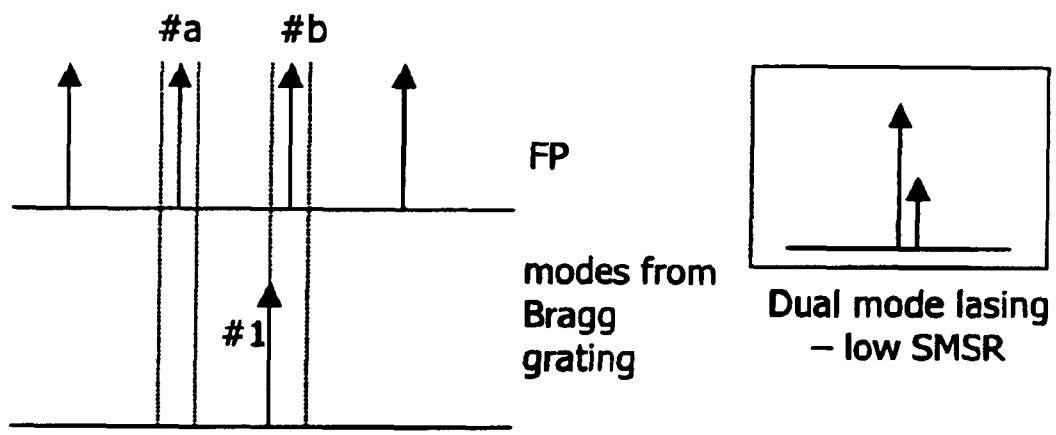

FIG. 1 shows both the FP modes (arising from either two of the three mentioned interfaces) and modes from the Bragg grating. If the grating mode #1 is out of the capture range of the FP modes #a and #b, it is possible to get good single mode lasing with high SMSR. Tuning of the wavelength is achieved by varying the Bragg current, which changes the Bragg grating mode. As shown in FIG. 2, with wavelength tuning, the Bragg grating mode moves into the capture range of the FP mode #b. The lasing wavelength will then display a sudden jump to the wavelength of the FP mode #b. This constitutes a mode hop, and in this state, it is possible to observe competing modes in the lasing spectrum, providing a much reduced SMSR. With further tuning of the Bragg current, the Bragg grating mode #1 will leave the capture range of the FP mode #b and normal single mode operation resumes. This mode hopping process will be repeated every time the Bragg grating mode approaches an FP mode. It is therefore important to erase the FP modes if one wishes to achieve continuous mode hop-free single mode operation.

As will be explained below, in the present invention, the back reflection from the air-Bragg interface is eliminated by rendering the Bragg section much longer, to the extent of achieving a SMSR of more than 35 dB from the Bragg gratings. This means that essentially no light reaches the air-Bragg interface. In addition, the interface between the gain and Bragg sections is also graded out via quantum well intermixing so as to greatly reduce the Fresnel reflection. In this manner, FP modes cannot be formed with just the air-gain section interface. This interface could, of course, be AR coating, but a very low reflection coating is not required.

Figure 3:
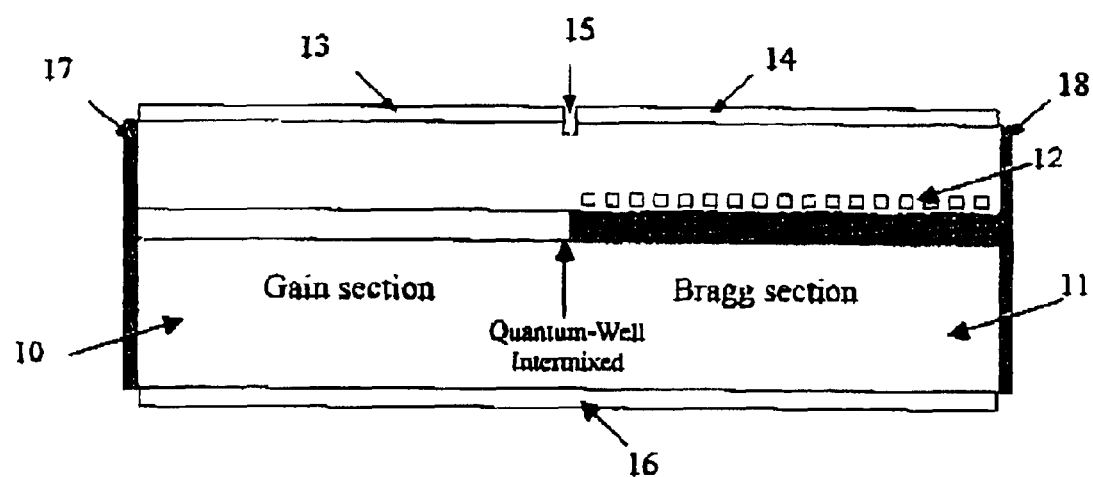
FIG. 3 is an example of a two-section DBR laser, according to the present invention.

FIG. 3 shows the structure of a two section DBR laser according to the present invention. The laser comprises a gain section 10 to provide the optical amplification necessary for laser operation and a Bragg section 11, comprising a distributed reflecting structure 12, which allows for tuning of the wavelength by varying the effective refractive index through electrical current injection.

Separate electrodes 13, 14 are provided for current injection to the gain and Bragg sections, with electrical isolation between these two-sections being achieved by a suitably etched or implanted isolation trench 15. The two sections do, however, share a common ground electrode 16. The facet at the air-gain interface acts as the output coupler 17 and will typically be coated with a low reflectivity coating (1–5%), at the lasing wavelength, in order to provide sufficient feedback for lasing whilst minimizing the possible build-up of unwanted cavity modes.

In order to help suppress unwanted modes, the facet of the Bragg-air interface is coated with an antireflection reflection (AR) coating 18 (reflectivity typically less than 1%). The length of the Bragg section 11 is also chosen to minimize unwanted reflected light arising from the residual reflectivity associated with the rear facet of the Bragg section. The requirement for the AR coating 18 of this facet is therefore much less stringent than for a conventional two-section DBR laser. In fact, if a monitoring photodiode is integrated with the laser diode, located just behind the Bragg section 11, the AR coating can be omitted, as any residual light will be absorbed by the photo-detecting section of the device.

The structure of the gain and Bragg sections 10, 11 may be fabricated using conventional epitaxial growth technology, such as MOCVD or MBE, from semiconductor materials such as GaAs/AlGaAs and InGaAsP/InP. The gain section comprises a material which, when injected with electrical current, provides optical amplification. The Bragg section, comprises a material that is quantum well intermixed to ensure a higher bandgap energy than the gain section, thereby reducing the intrinsic material loss at the emission wavelength of the device. The distributed reflecting structure 12 of the Bragg section 11 may comprise buried gratings, surface gratings or any other form of grating that can provide the required reflectivity. For an InGaAsP/InP material-based laser diode operating at 1.55 $\mu$m, the typical width of waveguide is in the range 1 to 3 $\mu$m, for all the sections of the device. The length of the gain section 10 is between 300 to 500 $\mu$m, with a Bragg section of between one to three times this length, notably longer than in conventional designs. The tuning range of such a grating can extend from 10 to 15 nm. For a typical band gap difference between the gain and Bragg sections of 70 nm, achieved by a QWI process, the refractive index difference is calculated to be 0.075 (see "Photonic integrated circuits fabricated using ion implantation", IEEE J. Select. T. Quantum Electron., vol. 4, no. 4, 1998). Assuming a gradual interface, with a linear variation in refractive index over a QWI transition length of 2 $\mu$m between the gain and Bragg sections, the effective interface reflectivity is calculated to be only $1 \times 10^{-5}$. This reflectivity can be further reduced by enlarging the transition region with a controlled amount of QWI across the interface.

Figure 4:
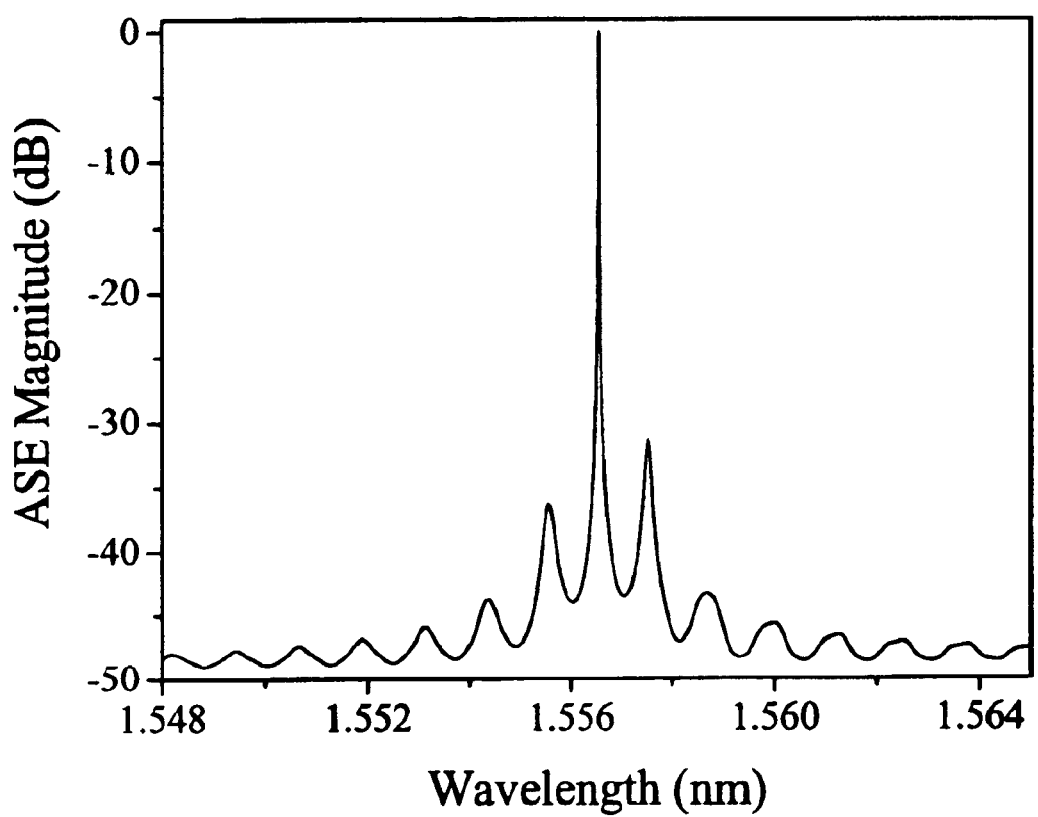
FIG. 4 shows the amplified spontaneous emission spectra of the two-section DBR laser.
Figure 5:
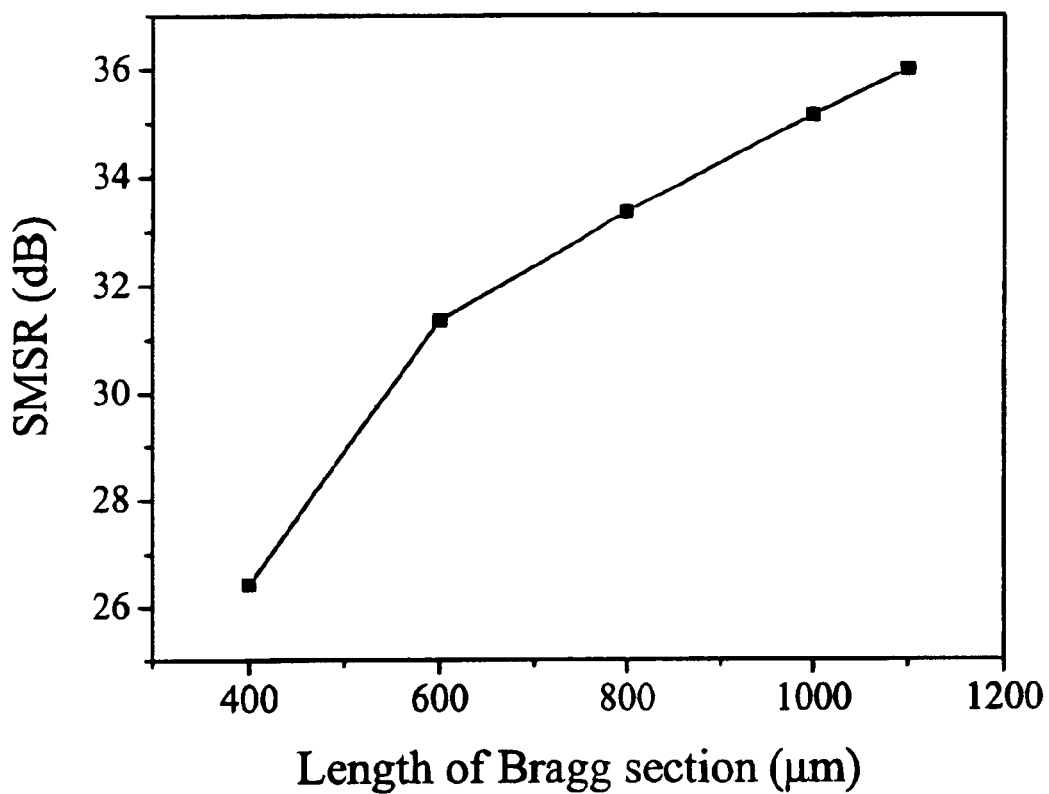
FIG. 5 shows the variation in SMSR with Bragg section length.

FIG. 4 shows the amplified spontaneous emission (ASE) spectrum of the two-section DBR laser described above. The gain section length is 300 $\mu$m, while that of the Bragg section is 600 $\mu$m. Both end facets are taken to have a low reflectivity (2%) coating. By comparing the strength of the peak emission wavelength to the nearest side lobe, it can be seen that a large side-mode suppression ratio (SMSR), of above 30 dB, can be achieved with this structure. The dependence of the SMSR on the length of the Bragg section is shown in FIG. 5, indicating that a longer Bragg section leads to less unwanted feedback in the cavity and consequently a larger SMSR. However, the increase in SMSR saturates at around 35 dB as the length of the Bragg section is increased above 1000 $\mu$m. With such a long Bragg section, the amount of light reaching the rear facet, being reflected, and then propagating back through the distributed reflector is negligible.

Figure 6:
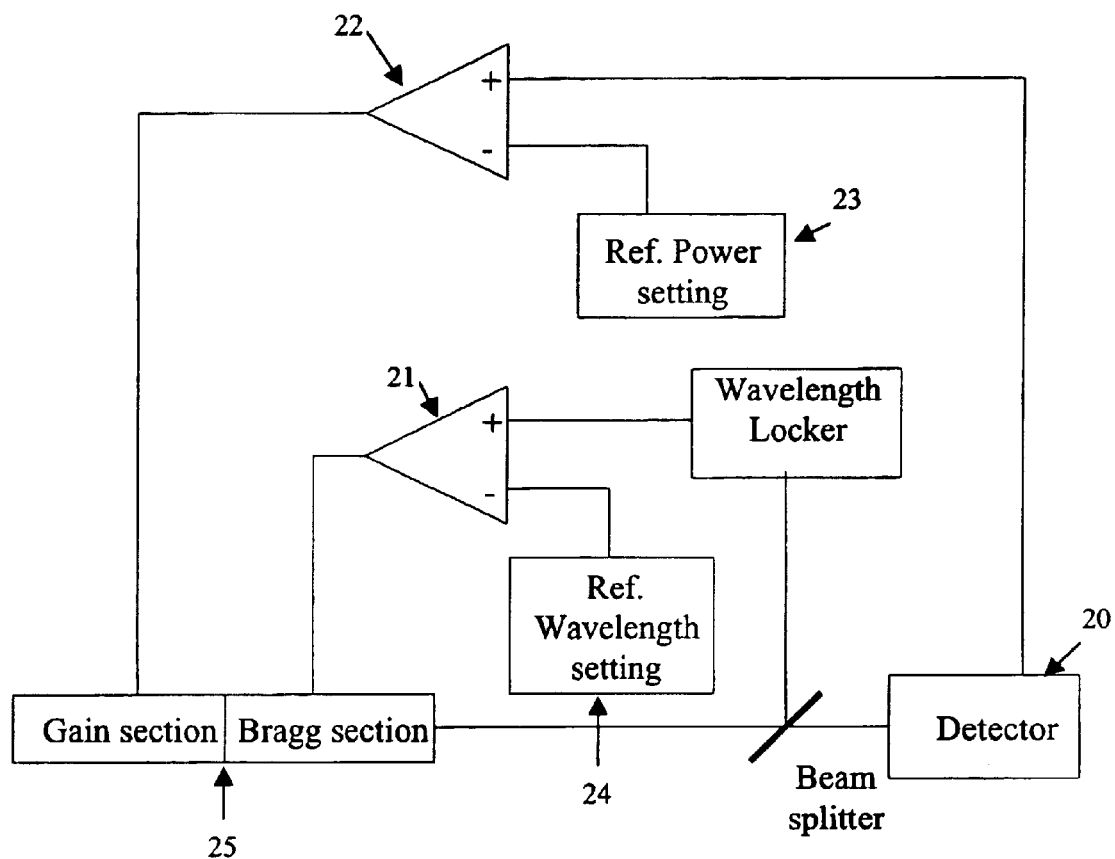
FIG. 6 is a schematic diagram of the apparatus for calibrating or stabilizing the two section DBR laser.

Further improvements to the performance of the two-section DBR laser can be made including stabilizing the output power and wavelength, by using conventional techniques such as monitor detectors, filters and feedback control loops, for example. The schematic of FIG. 6 shows an example of a suitable feedback and control system. Detectors 20 can be integrated internally or externally, to monitor the output power and wavelength. By feeding the resulting signals into error amplifiers 21, 22 together with signals derived from a reference power 23 and wavelength 24, variations in the output power and wavelength can be detected. With the addition of a feedback loop and control electronics, the output power and wavelength of the laser 25 can be stabilized via adjustments to the current injected into the gain and Bragg sections.

As the device shown in FIG. 6 is a simple DBR with only two sections, the controlling algorithms are simpler than that required by conventional tunable laser designs. The hop-free operation means that only a simple, straight-forward look-up table is required for control and stabilization. Thus, as illustrated in FIG. 6, the microprocessors that are generally used in the control of conventional tunable laser diodes can be replaced by simple error amplifiers 21, 22 which are cheaper and faster in operation. Furthermore, the problems associated with device aging can be substantially mitigated, leading to a wavelength and power stabilized device which can exhibit long term hop-free operation, as compared to devices with more than two sections and correspondingly more electrodes.

What is claimed is:

1. A semiconductor laser comprising a gain section and an adjacent Bragg section, wherein output laser light is emitted via a facet at an interface between air and the gain section, the Bragg section comprising a distributed reflecting structure having a side-mode suppression ratio (SMSR) of 35 dB or more, and a length substantially greater than required to ensure single longitudinal mode operation of the laser, thereby in use substantially suppressing optical feedback from a facet at an interface between the Bragg section and air, and wherein an interface between the Bragg section and the gain section is quantum well intermixed, thereby rendering the interface substantially anti-reflecting at the wavelength of the laser.

2. A semiconductor laser according to claim 1, in which the Bragg section is longer than the gain section.

3. A semiconductor laser according to claim 2, in which the length of the Bragg section is between one and three times the length of the gain section.

4. A semiconductor laser according to claim 1, in which the facet at the interface between the Bragg section and air is anti-reflection coated at the wavelength of the laser.

5. A semiconductor laser according to claim 1, further comprising a photodiode to monitor the wavelength of the laser located adjacent to the facet at the interface between the Bragg section and air.

6. A semiconductor laser according to claim 1, in which the facet at the interface between air and the gain section has a reflectivity of between one and five per cent.

7. A semiconductor laser according to any preceding claim 1, in which the distributed reflecting structure in the Bragg section comprises a buried grating or surface grating.

8. A semiconductor laser according to claim 1, in which the Bragg section is quantum well intermixed to increase its bandgap energy, thereby rendering the Bragg section substantially transparent at the wavelength of the laser.

9. A semiconductor laser according to claim 8, in which a transition region substantially centered on an interface between the gain section and the Bragg section is quantum well intermixed to produce a smooth monotonic refractive index profile, thereby rendering the transition region substantially anti-reflecting at the wavelength of the laser.

10. A semiconductor laser according to claim 9, in which the transition region has a length comparable with the wavelength of the laser.

11. A semiconductor laser according to any preceding claim 1, further comprising an electrode for injecting electrical current into the Bragg section, the injected current changing the Bragg wavelength of the distributed reflecting structure and thereby, in use, tuning the wavelength of the laser.

12. A semiconductor laser according to claim 11, wherein the electrical current is generated in dependence on a wavelength locking system, the wavelength locking system including a photodetector to monitor the wavelength of the laser output, a reference signal and control circuitry, in use the wavelength locking system tuning and substantially locking the wavelength of the laser to a wavelength determined by the reference signal.

13. A semiconductor laser, comprising:
 a gain section;
 a facet located at an interface between said gain section and air, said facet emitting output laser light at a wavelength;
 a Bragg section, formed adjacent to said gain section and coupled to said gain section via a second interface, wherein said second interface is quantum well intermixed to render said second interface substantially anti-reflecting at said wavelength; and
 a photodiode adjacent to said facet and configured to monitor said wavelength;
 said Bragg section comprising a distributed reflecting structure having a side-mode suppression ratio (SMSR) of 35 dB or more and a length substantially greater than required to ensure single longitudinal mode operation of the laser, thereby in use substantially suppressing optical feedback from a second facet at an interface between said Bragg section and air.

14. The semiconductor laser of claim 13, wherein said Bragg section is longer than said gain section.

15. The semiconductor laser of claim 13, wherein said second facet is anti-reflection coated at said wavelength.

16. The semiconductor laser of claim 13, wherein said facet has a reflectivity of between one and five percent.

17. The semiconductor laser of claim 13, wherein said distributed reflecting section comprises at least one of a buried grating and a surface grating.

18. A semiconductor laser, comprising:
 a gain section;
 a facet located at an interface between said gain section and air, said facet emitting output laser light at a wavelength;
 a Bragg section, formed adjacent to said gain section and coupled to said gain section via a second interface, wherein said second interface is quantum well intermixed to render said second interface substantially anti-reflecting at said wavelength, said Bragg section comprising a distributed reflecting structure having a length selected to substantially suppress optical feedback from a second facet at an interface between said Bragg section and air;
 an electrode coupled to said Bragg section, for injecting electrical current into said Bragg section, the injected current changing the Bragg wavelength of said distributed reflecting structure configured to tune said wavelength; and
 a photodiode adjacent to said facet and configured to monitor said wavelength.

19. The semiconductor laser of claim 18, further comprising a wavelength locking system, wherein said injected electrical current is generated dependence on said wavelength locking system, said wavelength locking system comprising:
 a photodetector to monitor said wavelength; and
 a reference signal and control circuitry, coupled to said photodetector, wherein said wavelength locking system is configured to tune and substantially lock said wavelength to a wavelength determined by said reference signal.

* * * * *